United States Patent [19]
Stellenberg et al.

[11] Patent Number: 6,167,364
[45] Date of Patent: Dec. 26, 2000

[54] METHODS AND APPARATUS FOR AUTOMATICALLY GENERATING INTERCONNECT PATTERNS IN PROGRAMMABLE LOGIC DEVICES

[75] Inventors: Daniel S. Stellenberg, Santa Clara; David Karchmer, Sunnyvale, both of Calif.

[73] Assignee: Altera Corporation, San Jose, Calif.

[21] Appl. No.: 09/153,754

[22] Filed: Sep. 15, 1998

Related U.S. Application Data

[60] Provisional application No. 60/082,090, Apr. 17, 1998.

[51] Int. Cl.[7] ............................ G06F 17/50; G06G 7/62
[52] U.S. Cl. ............................ 703/19; 703/14; 703/20; 716/4
[58] Field of Search ................... 703/13, 14, 15, 703/19, 20; 714/725; 716/4, 5, 6

[56] References Cited

U.S. PATENT DOCUMENTS

| | | | |
|---|---|---|---|
| 4,450,560 | 5/1984 | Conner | 371/25 |
| 4,517,512 | 5/1985 | Petrich et al. | 324/73 |
| 4,517,661 | 5/1985 | Graf et al. | 364/900 |
| 4,806,852 | 2/1989 | Swan et al. | 324/73 |
| 5,164,665 | 11/1992 | Yamashita et al. | 324/158 |
| 5,263,149 | 11/1993 | Winlow | 395/500.36 |
| 5,305,229 | 4/1994 | Dhar | 364/489 |
| 5,381,345 | 1/1995 | Takegami et al. | 364/491 |
| 5,396,435 | 3/1995 | Ginetti | 364/489 |
| 5,500,808 | 3/1996 | Wang | 364/578 |
| 5,717,699 | 2/1998 | Hang et al. | 714/725 |
| 5,949,983 | 9/1999 | Baxter | 395/500.36 |

Primary Examiner—Kevin J. Teska
Assistant Examiner—Samuel Broda
Attorney, Agent, or Firm—Beyer Weaver & Thomas, LLP

[57] ABSTRACT

Methods and apparatus are described for generating circuit parameters for a plurality of interconnect line circuit models. The plurality of circuit models represent a plurality of interconnect lines in a programmable logic device (PLD). Design description data corresponding to the PLD are generated at least in part from spreadsheet representations of the plurality of interconnect lines. A device model for the PLD is generated using estimated circuit parameters and a plurality of mathematical equations representing the plurality of interconnect line circuit models. Operation of the PLD is simulated using the device model and the design description data thereby generating modeled delay data corresponding to the estimated circuit parameters. The modeled delay data are compared with measured delay data corresponding to the plurality of interconnect lines. Where all of the modeled delay data are within an error limit of corresponding measured delay data, the estimated circuit parameters are designated as the circuit parameters.

19 Claims, 10 Drawing Sheets

```
fptri    1 2 2 2 2 2 2 2 2 2 2 2 2 2 2 2 2 2 2 2 2 2 2 2 2 2 2 2 2 2 2 2
fpclk0l  1 2 2 2 2 2 2 2 2 2 2 2 2 2 2 2 2 2 2 2 2 2 2 2 2 2 2 2 2 2 2 2
fpclk0h  1 2 2 2 2 2 2 2 2 2 2 2 2 2 2 2 2 2 2 2 2 2 2 2 2 2 2 2 2 2 2 2
```

| | | | | | | | |
|---|---|---|---|---|---|---|---|
| LC1_A1 | B | | | > | | A | LC1_A2 |
| LC1_A1 | D | | | | | C | LC1_A2 |
| LC2_A1 | B | < | | | > | A | LC2_A2 |
| LC2_A1 | D | > | < | | | C | LC2_A2 |
| LC3_A1 | B | < | | | > | A | LC3_A2 |
| LC3_A1 | D | | > | | | C | LC3_A2 |
| LC4_A1 | B | | < | | | A | LC4_A2 |
| LC4_A1 | D | | | | < | C | LC4_A2 |
| LC5_A1 | B | | > | | | A | LC5_A2 |
| LC5_A1 | D | | | | | C | LC5_A2 |
| LC6_A1 | B | | | > | | A | LC6_A2 |
| LC6_A1 | D | | | | | C | LC6_A2 |
| LC7_A1 | B | | | | | A | LC7_A2 |
| LC7_A1 | D | | | | | C | LC7_A2 |
| LC8_A1 | B | | | | | A | LC8_A2 |
| LC8_A1 | D | | | | | C | LC8_A2 |
| LC9_A1 | B | | | | | A | LC9_A2 |
| LC9_A1 | D | | | | | C | LC9_A2 |
| LC10_A1 | B | | | > | | A | LC10_A2 |
| LC10_A1 | D | | | | | C | LC10_A2 |

METHODS AND APPARATUS FOR AUTOMATICALLY GENERATING INTERCONNECT PATTERNS IN PROGRAMMABLE LOGIC DEVICES

This application claims the benefit of U.S. Provisional Application No. 60/082,090 filed on Apr. 17, 1998, the disclosure of which is incorporated herein by reference.

RELATED APPLICATION DATA

The present application claims the benefit of U.S. Provisional Application No. 60/082,090 for AUTOMATED INTERCONNECT ANALYSIS filed on Apr. 17, 1998, the entirety of which is incorporated herein by reference for all purposes.

BACKGROUND OF THE INVENTION

The present invention relates to the development of software timing models for integrated circuits. More specifically, the present invention provides methods and apparatus by which such timing models may be automatically generated for programmable logic devices (PLDs).

Circuit designers who use programmable logic devices to implement their designs typically revise and optimize their designs with exhaustive and detailed timing simulations. In order to perform such simulations, detailed and accurate characterization information regarding the loads presented by the device's interconnect structure must be provided by the PLD vendor. The interconnect structure of a PLD typically comprises a large number of intersecting conductors which enable the designer to electrically connect virtually any two points in the device. For a timing simulation to be useful, the propagation delay from each signal source to each signal destination must be accurately modeled.

In the past, PLDs were small enough so that a sufficiently accurate model for interconnect line delays was easily derived. For example, a linear formula might be used where the delay is proportional to the length of the interconnect signal path. Another approach simply used constants to represent the delay for particular lines. However, as the chips have become larger and more complex with smaller process geometries, the accuracy and therefore the sufficiency of these simplistic models has correspondingly decreased.

It will be understood that more sophisticated modeling of PLD interconnects may be and indeed has been accomplished. Unfortunately, the circuit density of the current PLD state of the art has made the development of such interconnect characterization models a very time intensive, and therefore very expensive procedure.

It is therefore desirable to develop techniques by which more sophisticated and accurate models of PLD interconnect lines may be generated. It is also desirable that such techniques enable the generation of such models more quickly than current techniques.

SUMMARY OF THE INVENTION

According to the present invention, techniques are provided which automate large portions of the process by which the parameters for PLD interconnect circuit models are determined. Each interconnect line in a PLD is first represented in a spreadsheet format according to its pattern of connections within the device. Using packaging information about the PLD and the spreadsheet representations of the interconnect patterns, design description files are generated which are then employed to measure interconnect delays in actual devices. The spreadsheet representations of the interconnect patterns are also used to generate an analysis workbook which is later used to compare the measured delay data with modeled delay data generated from a simulation of a device model of the PLD. The PLD model is generated using the interconnect pattern information in the analysis spreadsheets and a set of mathematical equations which represent circuit models of the interconnect lines. The simulation of the PLD model begins with initial estimates of the interconnect circuit parameters. If the modeled delays generated by the simulation of the PLD model do not compare favorably with the previously measured delays, the generation and simulation of the PLD model is iterated with appropriate adjustments to the estimates of the interconnect circuit parameters until the comparison is within acceptable limits. At this point, the estimates of the interconnect circuit parameters are designated as the parameters.

Thus, the present invention provides methods and apparatus for generating circuit parameters for a plurality of interconnect line circuit models. The plurality of circuit models represent a plurality of interconnect lines in a programmable logic device (PLD). Design description data corresponding to the PLD are generated at least in part from spreadsheet representations of the plurality of interconnect lines. A device model for the PLD is generated using estimated circuit parameters and a plurality of mathematical equations representing the plurality of interconnect line circuit models. Operation of the PLD is simulated using the device model and the design description data thereby generating modeled delay data corresponding to the estimated circuit parameters. The modeled delay data are compared with measured delay data corresponding to the plurality of interconnect lines. Where all of the modeled delay data are within an error limit of corresponding measured delay data, the estimated circuit parameters are designated as the circuit parameters.

A further understanding of the nature and advantages of the present invention may be realized by reference to the remaining portions of the specification and the drawings.

BRIEF DESCRIPTION OF THE DRAWINGS

FIG. 5 shows a portion of a spreadsheet in a graphical user interface (GUI) representing interconnection patterns associated with PLD interconnect lines;

FIG. 6 shows a portion of a spreadsheet in a graphical user interface (GUI) representing interconnection patterns associated with PLD peripheral lines;

DESCRIPTION OF SPECIFIC EMBODIMENTS

Figure 1:
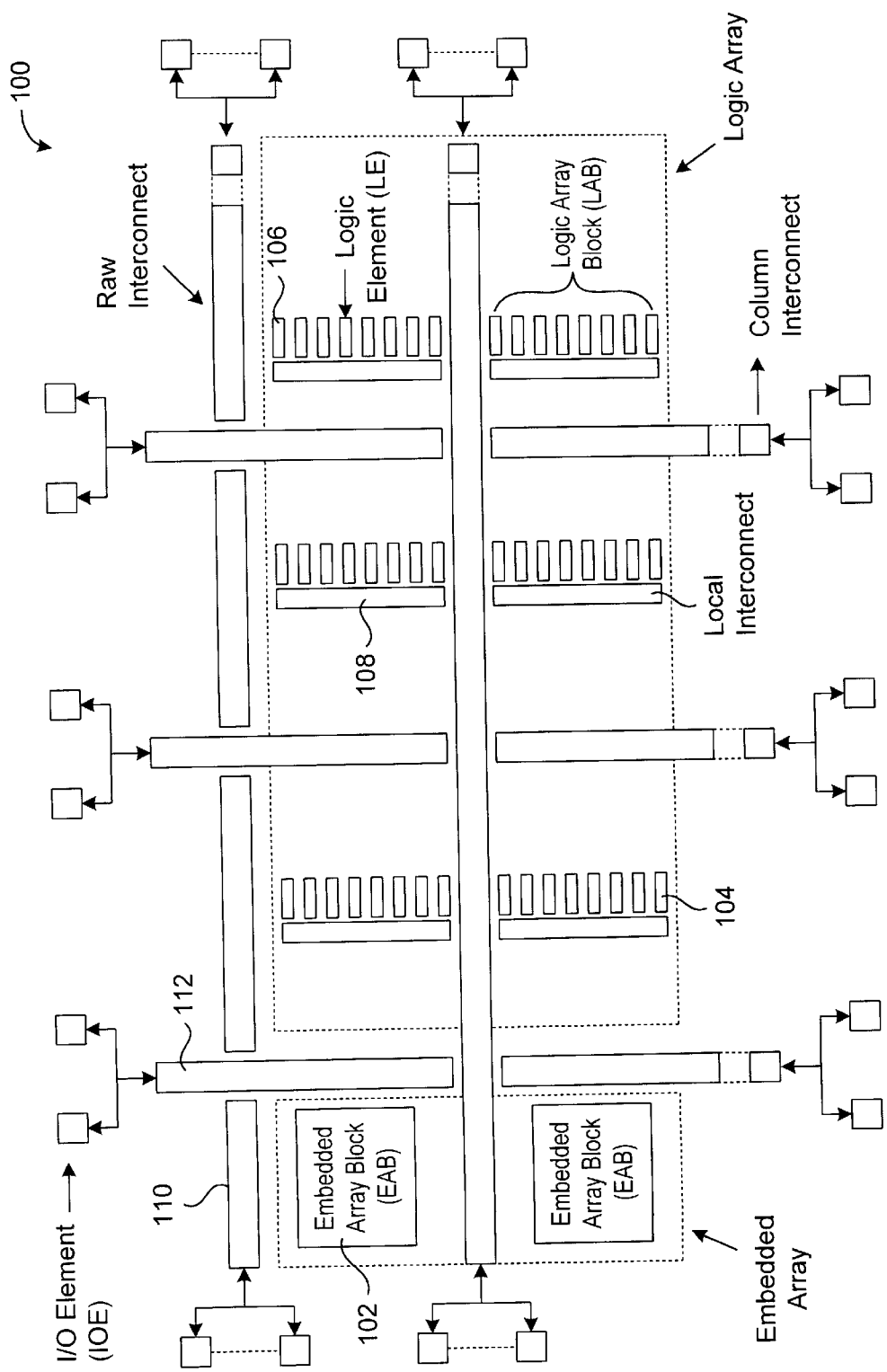
FIG. 1 shows the architecture of a typical PLD for which interconnect line parameters may be generated according to the present invention.

FIG. 1 shows the architecture of a typical PLD 100 for which interconnect line parameters may be generated according to the techniques described herein. PLD 100 includes a plurality of embedded array blocks of logic (EABs) 102 as well as a plurality of logic array blocks (LABs) 104. Each LAB 104 includes a plurality of logic elements (LEs) 106 which are selectively interconnected via local interconnect lines 108). Similarly, each of LABs 104 is selectively interconnected with others of LABs 104 via global horizontal (GH) interconnect lines 110, global vertical (GV) interconnect lines 112, and half horizontal (HH) interconnect lines (not shown). These interconnections may be achieved according to any of a variety of techniques known in the art. For example, programmable switches, e.g., pass transistors, (not shown) may be used at the intersections of interconnect lines with other interconnect lines and/or logic circuitry.

Figure 2:
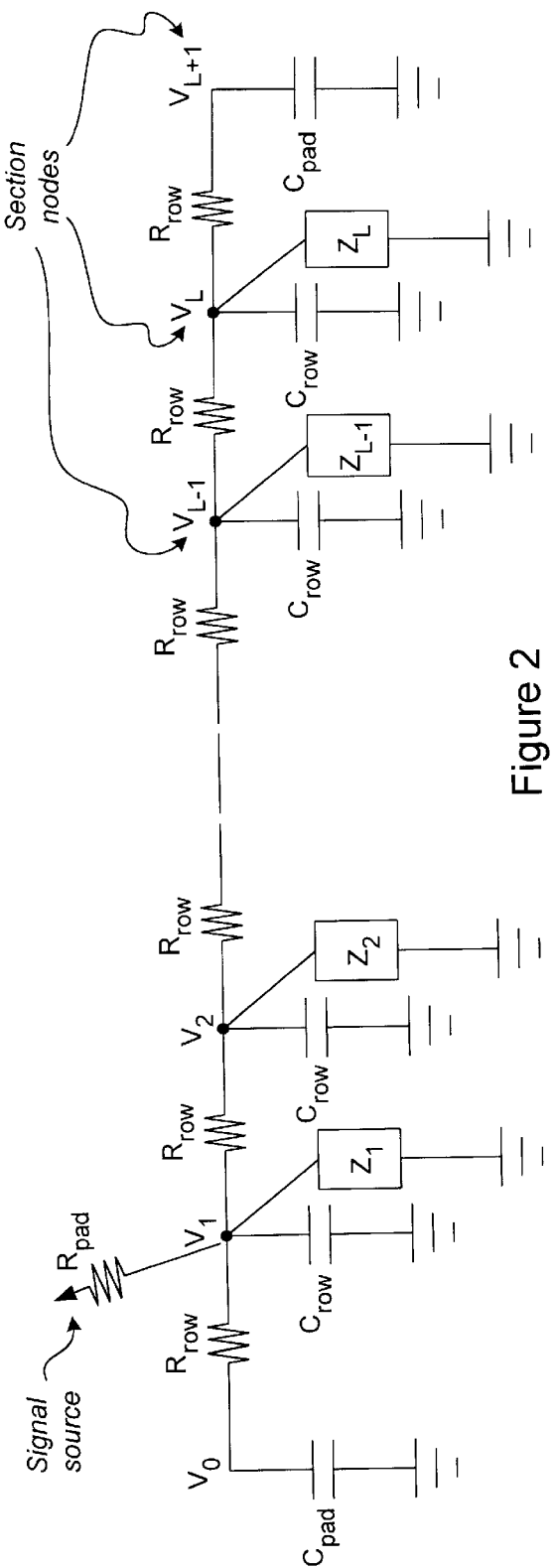
FIG. 2 shows a circuit model for a PLD interconnect line for use with a specific embodiment of the present invention.

As will be understood, the various interconnect lines of PLD 100 may be modeled according to a wide variety of sophisticated circuit modeling techniques. One such technique is described in commonly assigned, copending U.S. patent application Ser. No. 08/940,248 entitled FAST MODELING OF SIGNAL PROPAGATION DELAYS THROUGH INTERCONNECT WIRES WITH ARBITRARY LOAD DISTRIBUTION filed on Sep. 30, 1997, the entirety of which is incorporated herein by reference for all purposes. The described technique models PLD interconnect lines as distributed networks of resistors and capacitors. The interconnect circuit model is shown in FIG. 2. According to the model, each interconnect line is represented as a ladder network of resistors and capacitors with arbitrary load models attached to the network at any point to simulate the positions of various loads on the interconnect line. The load models, designated $Z_l$, are shown in more detail in FIG. 3.

Figure 3:
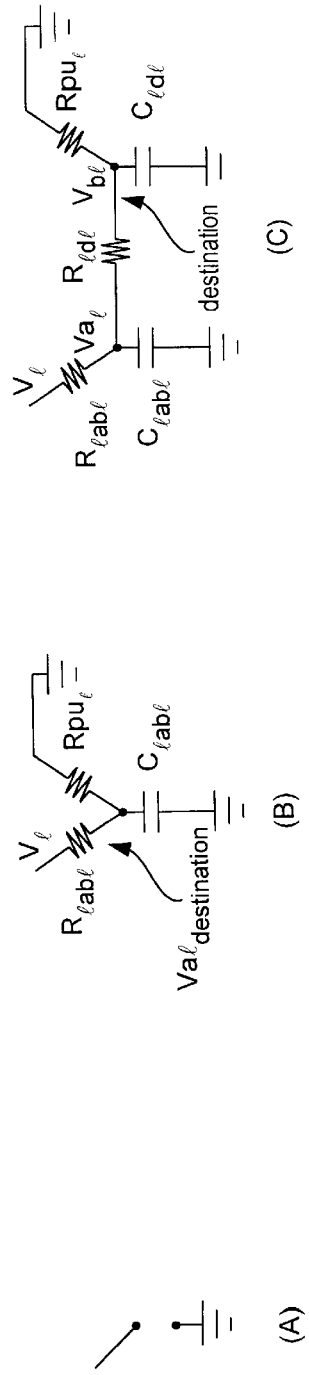
FIG. 3 shows three load models for use with the circuit model of FIG. 2.

The interconnect model shown in FIG. 2 includes a series of load sections each with a $C_{row}$ and a $Z_l$ and two termination sections, i.e., $C_{pad}$. When modeling a GH line, each load section corresponds to one LAB. The signal source is connected to the top of $R_{pad}$ which represents the programmable switch connecting the source to the signal path. The floating end of $R_{pad}$ drives either a load section node or a termination section node depending upon the position of the source being modeled. Referring to FIG. 3, load model (A) is for use with those nodes which have no load. Load model (B) is a first order load model for buffered loads, e.g., where one pass transistor is used to provide the interconnection. Load model (C) is a second order load model for unbuffered LAB loads and includes the propagation delay through the LAB local interconnect lines, e.g., where two or more pass transistors are used to provide the interconnections. It will be understood that the load models of FIGS. 2 and 3 may be generalized to create similar models for any of the interconnect conductors in a PLD. Moreover, the mathematical equations representing this modeling are completely described in the above referenced patent application.

Figure 4:
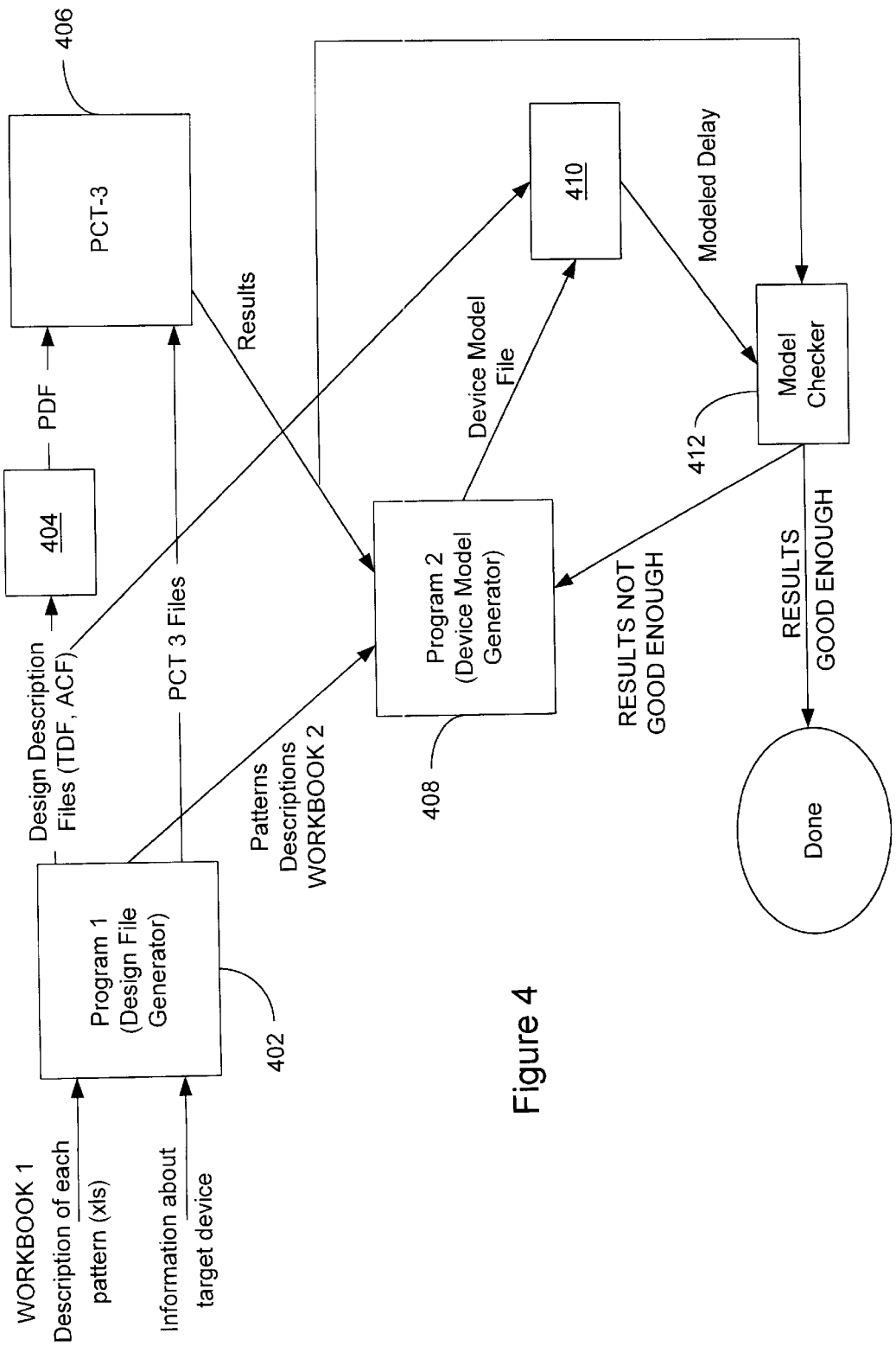
FIG. 4 is a flow diagram illustrating a process by which interconnect circuit model parameters for a PLD are determined according to a specific embodiment of the invention.
Figures 5, 6:
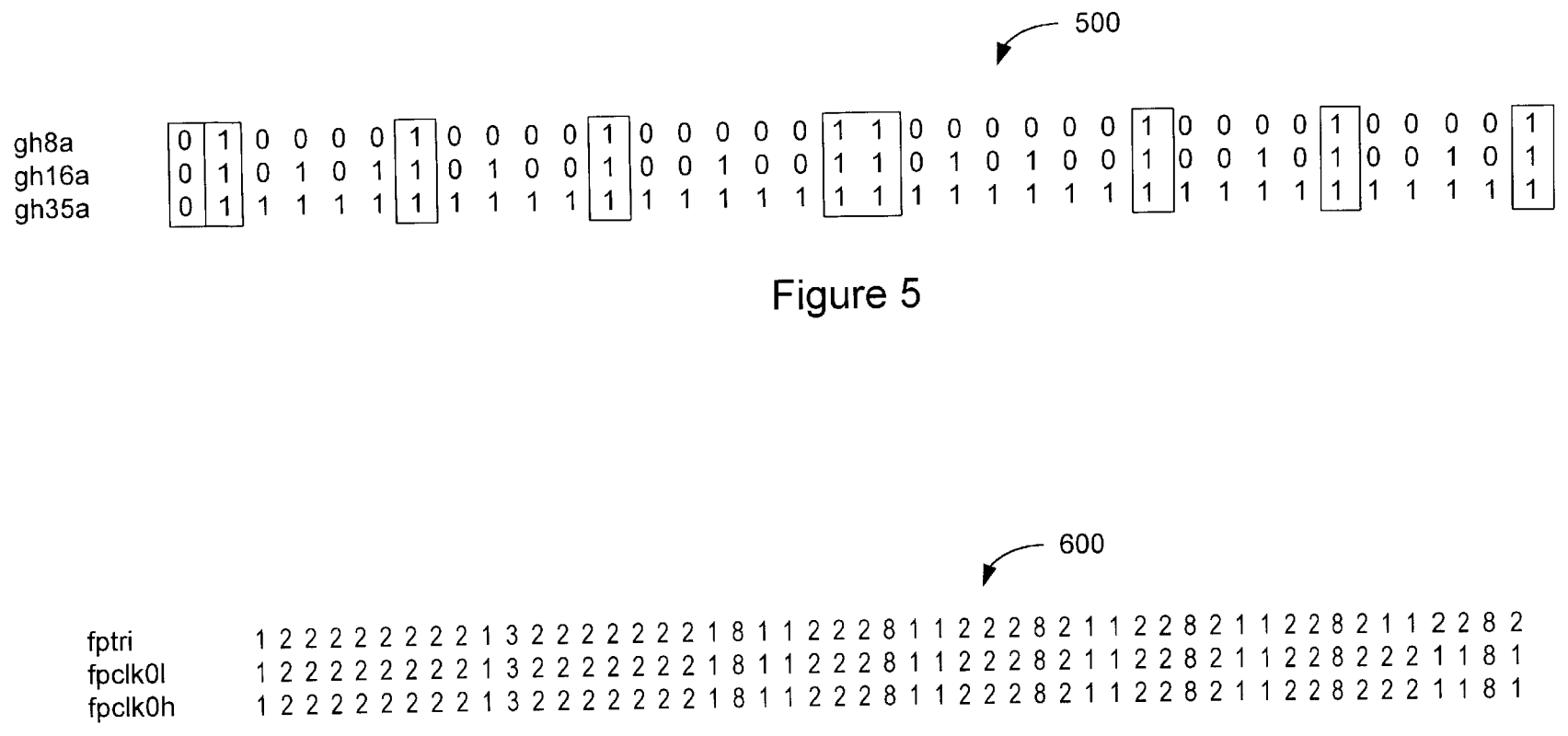

FIG. 4 is a process flow diagram which illustrates a process by which interconnect line parameters such as those described above with reference to FIGS. 1–3 may be determined. First, patterns for each interconnect line in a PLD (i.e., "Description of each pattern") are entered into a first set of spreadsheets (workbook 1) as shown in FIG. 5. All patterns represent register-to-register connections which allow for automated testing. The spreadsheet program used to implement the present invention may be any of a variety of commercially available spreadsheet programs such as, for example, Microsoft Excel distributed by Microsoft Corporation of Redmond, Wash.

Each row in a workbook 1 spreadsheet represents a single interconnect line. Each column represents a LAB. A "1" entry indicates that the corresponding interconnect line is connected to the corresponding LAB. Colors are used to differentiate between source registers, destination registers, and 1 cell destinations, i.e., logic elements. The three patterns shown in FIG. 5 represent three GH interconnect lines in a GH characterization pattern spreadsheet 500.

Just as the GH, GV, and HH interconnect lines of the PLD are represented as discussed above with reference to FIG. 5, peripheral clock and bus lines are also represented in a workbook 1 spreadsheet 600 as shown in FIG. 6 in which the patterns for three peripheral lines are shown. The representations are similar except that peripheral lines cannot drive any 1 cells. Moreover, for peripheral patterns all registers are assumed to be peripheral registers. Spreadsheet 600 links with a description of a pin table which describes the target PLD's package configuration, i.e., how each pin is used. Such a pin table may be represented in, for example, spreadsheet format which may, in turn, be incorporated into workbook 1. Each cell entry "n" in spreadsheet 600 indicates whether the next n entries are to be measured locations or not. Cell colors represent the following: make a destination that is measured, make a destination that is not measured, do nothing, or create a gap. Gap creation is used to model places along a peripheral line where there are no registers such as, for example, the location of an EAB.

Figures 7, 8:
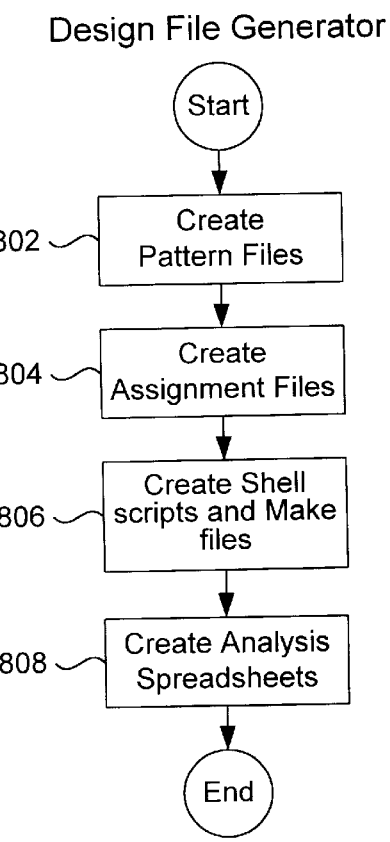
FIG. 7 shows a portion of a spreadsheet in a graphical user interface (GUI) representing parasitic effects associated with PLD interconnect lines.
FIG. 8 is a flowchart illustrating a process by which PLD design description files are generated according to a specific embodiment of the invention.
Figure 9:
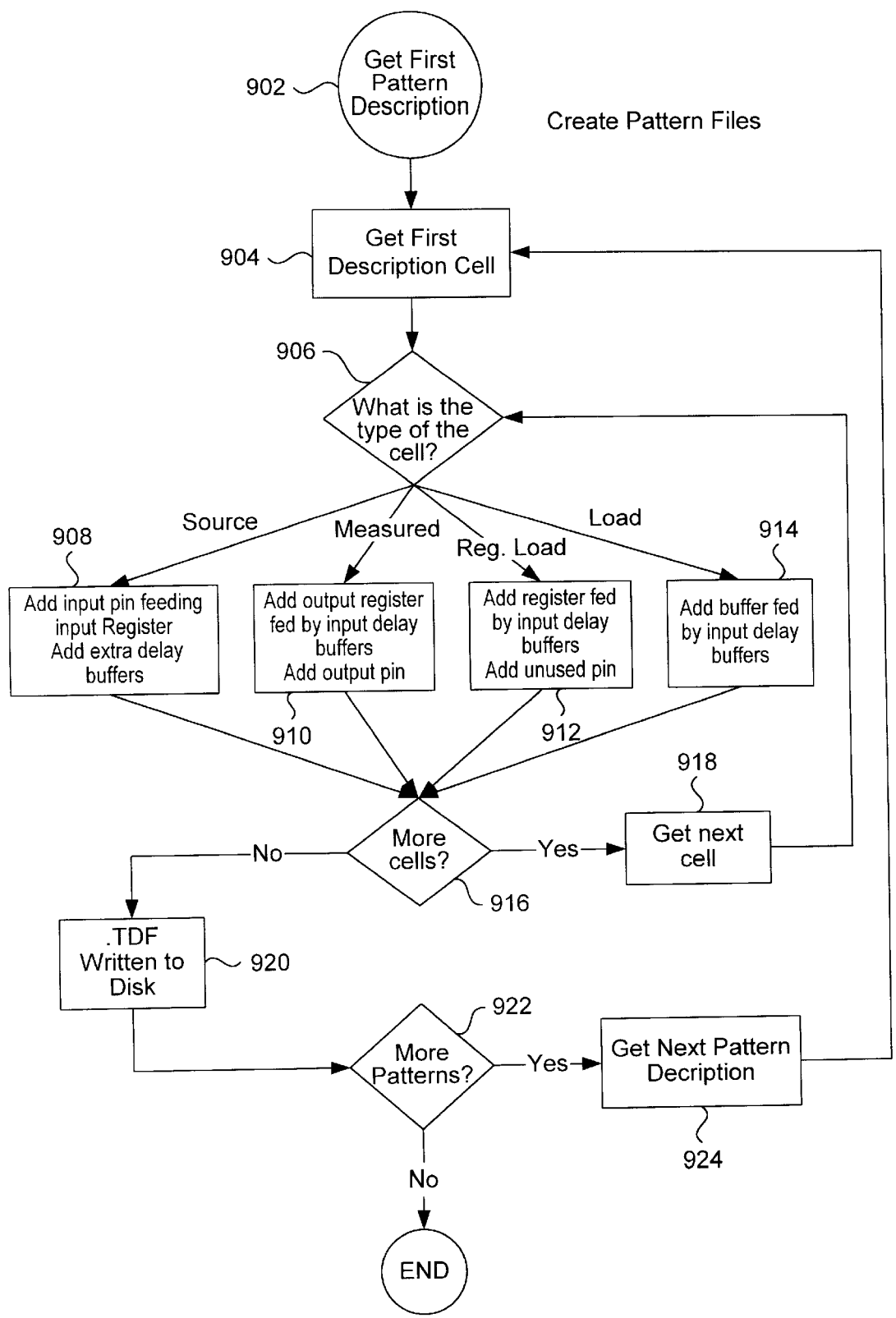
FIG. 9 is a flowchart illustrating a process by which PLD design files are generated according to a specific embodiment of the invention.

Finally, parasitic characterization patterns are represented in a spreadsheet 700 as shown in FIG. 7. Parasitic patterns represent the effects of loading along local interconnect lines. The shaded column represents the column with the "true" or actual loads. The other three columns represent the other lines that can affect the "true" line parasitically. The "<" and ">" characters indicate whether a particular line drives the associated logic element to the left or to the right. Different colors in the shaded column indicate whether the "true" line is driving a measured register or an 1 cell.

Referring back to FIG. 4, using the spreadsheets of workbook 1, i.e., "Description of each pattern", and packaging information for the particular PLD, i.e., "Information about target device", .TDF and .ACF files, i.e., "Design Description Files", are created by Program 1 (Design File Generator) 402. The .TDF files may be text (e.g., HDL) or graphic design entry files. The .ACF files are assignment configuration files which define the physical constraints of the design, i.e., allocate the physical resources of the chip, i.e., a layout description.

In addition, a second set of analysis spreadsheets (workbook 2), i.e., "Pattern Descriptions", are generated by Program 1 using the information in workbook 1. The analysis spreadsheets of workbook 2 are intended to receive measured delay data from corresponding product engineering spreadsheets (i.e., "results") and modeled data from simulations of a device model as will be discussed below. Each analysis spreadsheet in workbook 2 corresponds to one of the patterns from the original spreadsheets of workbook 1.

Finally, along with the generation of the .ACF files, Program 1 generates PCT-3 files which include packaging information and test vectors to be applied by the PC tester (PCT-3) in product engineering to generate the measured delay data.

The manner in which the .TDF, .ACF, and PCT-3 files and the analysis spreadsheets of workbook 2 are generated will now be described with reference to FIGS. 8–12. FIG. 8 is a flowchart 800 illustrating the overall process of generating these files. Creation of pattern files, i.e., the .TDF design description files, (802) will be described with reference to the flowchart 900 of FIG. 9. Pattern descriptions from the spreadsheets of workbook 1 are selected one at a time beginning with the first pattern description (902). The first cell, i.e., description cell, from the currently selected pattern is then selected (904). Once the cell type has been determined (906) as indicated, for example, by its color in the GUI of FIG. 5, the appropriate hardware elements are added to the .TDF file being created. If the selected cell is a source register, an input pin feeding an input register is added along with input delay buffers (908). The delay buffers are for increasing the length of the propagation delays to be within the bandwidth of the test equipment. If the selected cell represents a measured destination register, an output register fed by input delay buffers and a corresponding output pin are added (910). If the cell represents an unmeasured register, a register fed by input delay buffers and a corresponding unused pin are added (912). Finally, if the cell represents an unmeasured load which is not a register, a buffer fed by input delay buffers is added (914). If there are more cells in the currently selected pattern (916), the next cell is selected (918) and the process repeats steps 906–914. If there are no more cells in the pattern (916), the .TDF for the selected pattern is written to memory (920). If there are more patterns for generating additional .TDF files (922), the next pattern is selected (924) and steps 904–922 are repeated. If there are no more patterns (922) the creation of the pattern files is complete.

Figure 10:
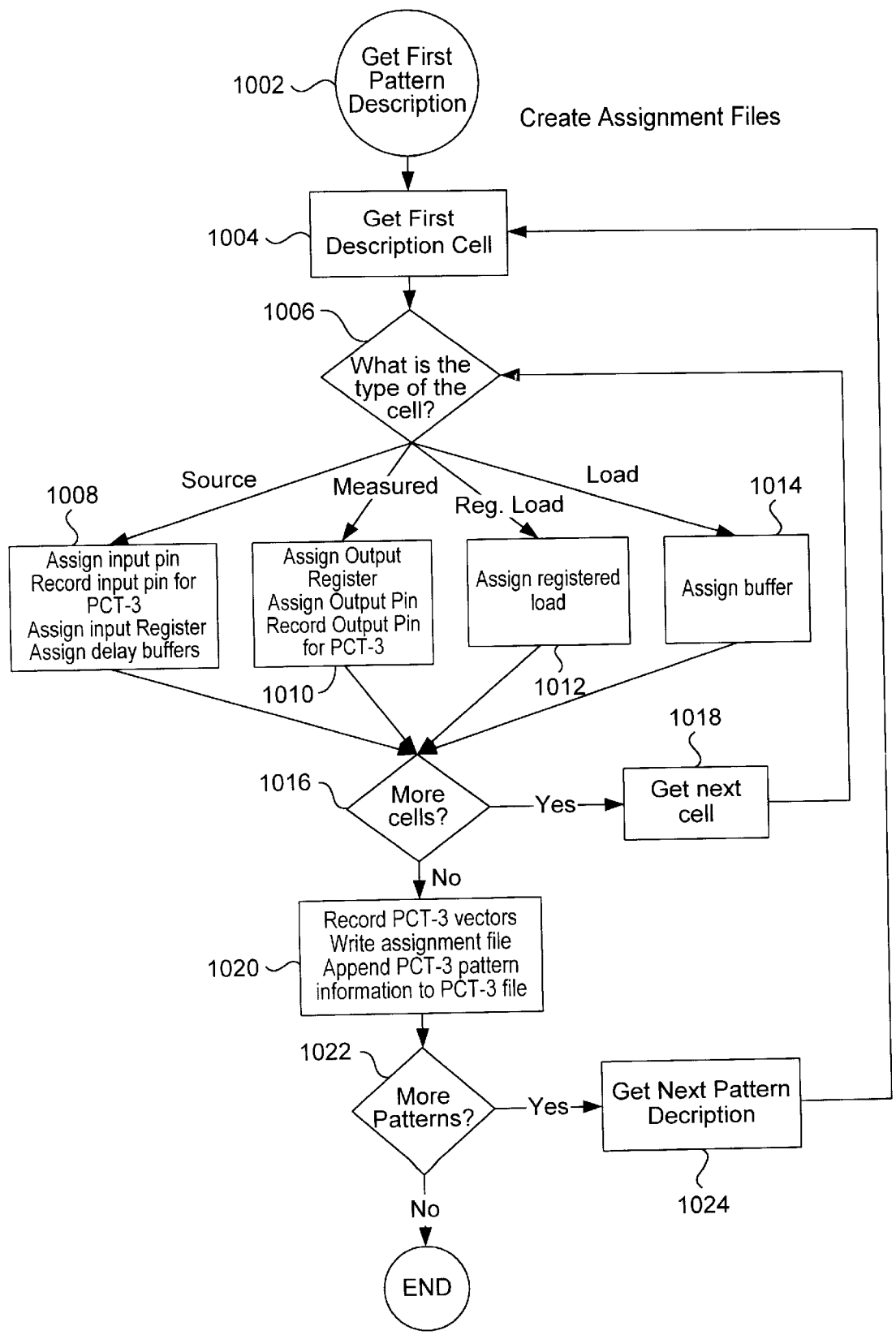
FIG. 10 is a flowchart illustrating a process by which PLD assignment files are generated according to a specific embodiment of the invention.

Referring back to FIG. 8, creation of assignment files, i.e., .ACF and PCT-3 files, (step 804) will be described with reference to FIG. 10. As with the generation of the pattern files, pattern descriptions from the spreadsheets of workbook 1 are selected one at a time beginning with the first pattern description (1002). The first cell from the currently selected pattern is then selected (1004). Once the cell type has been determined (1006), the appropriate device resources are allocated in the .ACF file being created and pin assignments are recorded in a corresponding PCT-3 pattern. If the selected cell is a source register, an input pin, an input register, and input delay buffers are assigned to the cell and the assigned input pin is recorded in the PCT-3 pattern (1008). If the selected cell represents a measured destination register, an output register and an output pin are assigned to the cell and the assigned output pin is recorded in the PCT-3 pattern (1010). If the cell represents an unmeasured register, a register is assigned to the cell (1012). Finally, if the cell represents an unmeasured load which is not a register, a buffer is assigned to the cell (1014). If there are more cells in the currently selected pattern (1016), the next cell is selected (1018) and the process repeats steps 1006–1014. If there are no more cells in the pattern (1016), the .ACF file is written to memory, the PCT-3 pattern information is appended to the PCT-3 file, and the predefined PCT-3 vectors are recorded (1020). If there are more patterns (1022), the next pattern is selected (1024) and steps 1004–1022 are repeated. If there are no more patterns (1022) the creation of the assignment files is complete.

Figure 11:
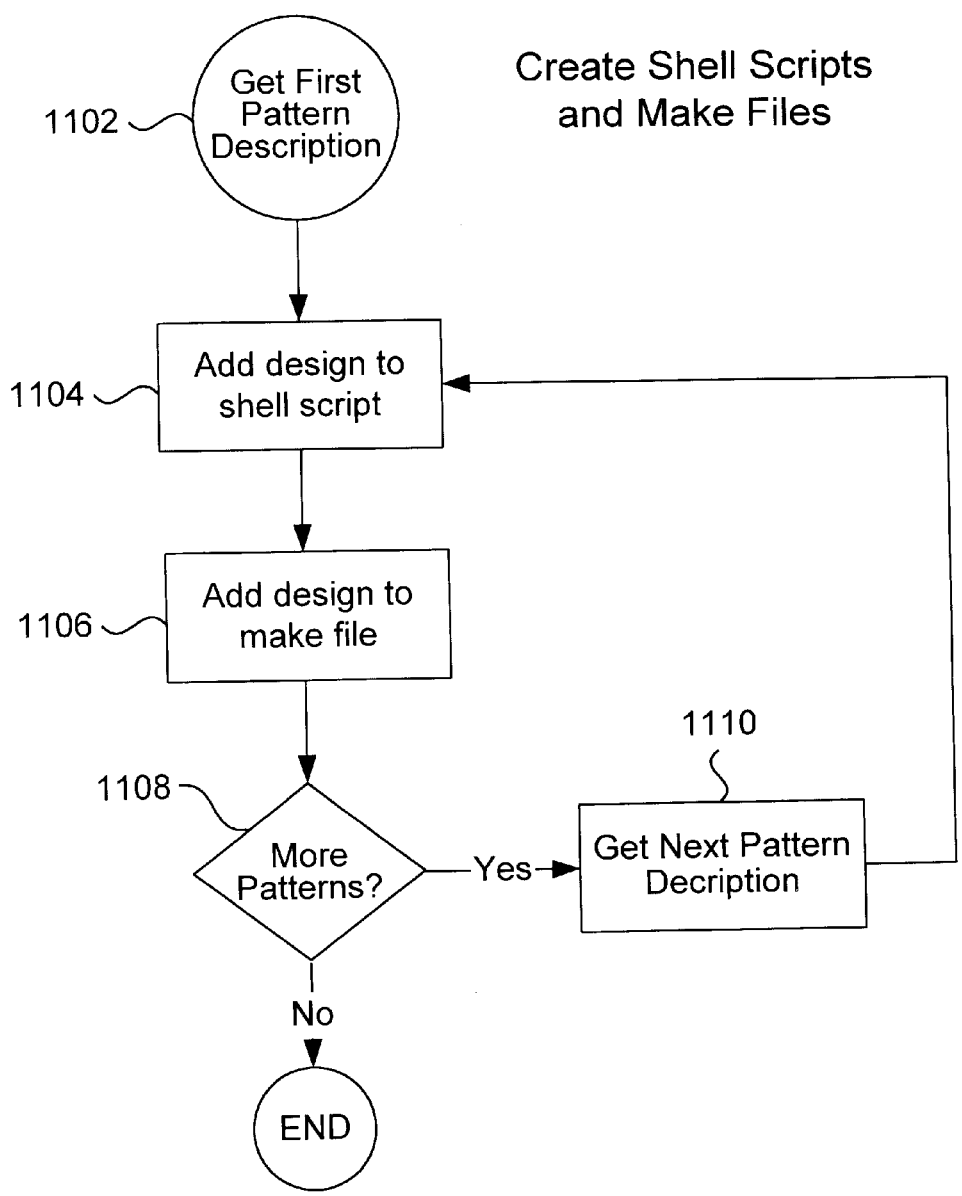
FIG. 11 is a flowchart illustrating a process by which PLD shell scripts and make files are generated according to a specific embodiment of the invention.

Referring back to FIG. 8, creation of shell scripts and make files (step 806) will be described with reference to FIG. 11. Shell scripts are batch file utilities which facilitate compilation of the .TDF files. Make files facilitate revision control for the .TDF and .ACF files. Pattern descriptions from the spreadsheets of workbook 1 are selected one at a time beginning with the first pattern description (1102). The design description files are then added to the appropriate shell script and make file (1104 and 1106). If there are more patterns (1108), the next pattern is selected (1110) and steps 1104–1108 are repeated. If there are no more patterns (1108) the creation of the shell scripts and make files is complete.

Figure 12:
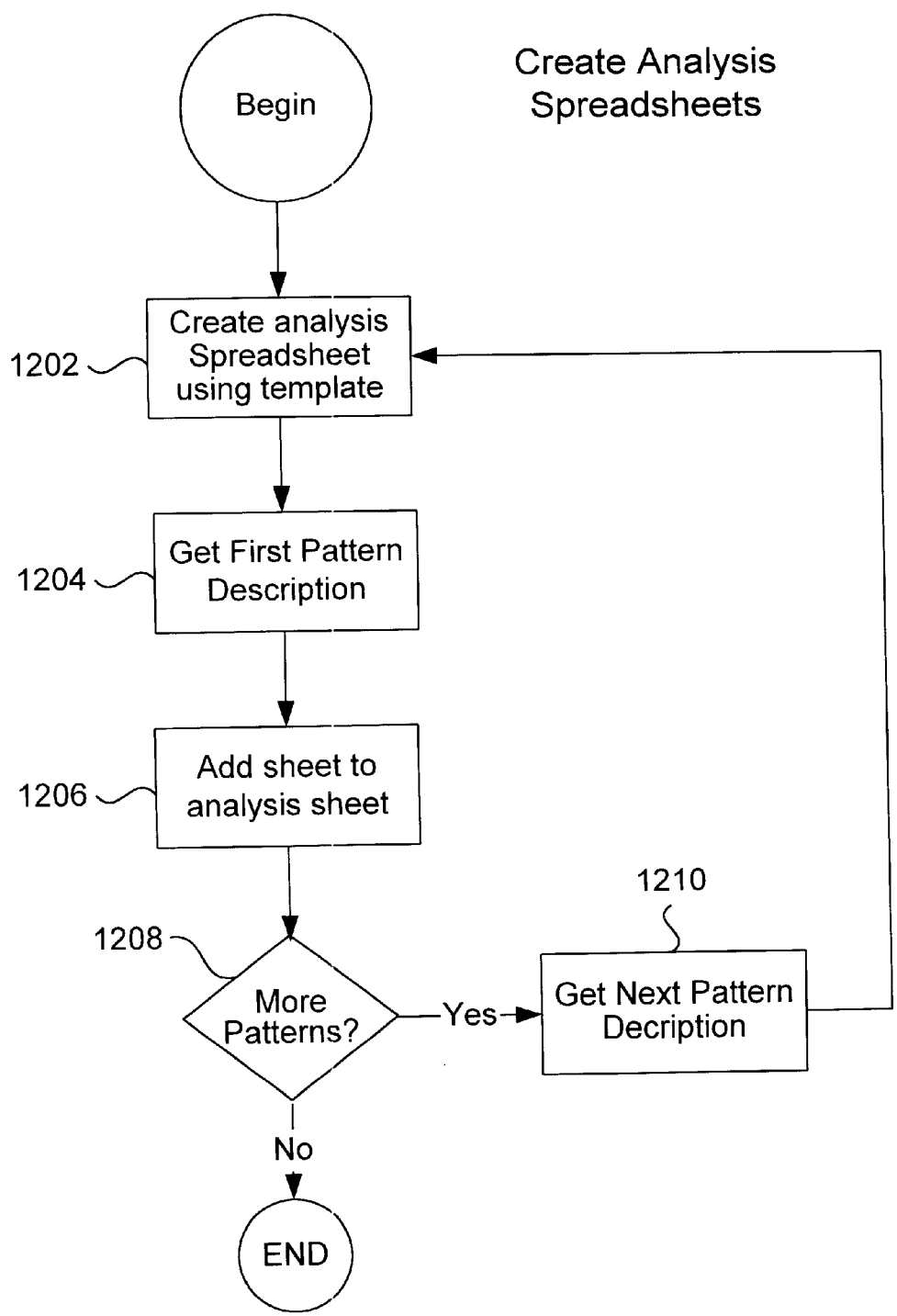
FIG. 12 is a flowchart illustrating a process by which analysis spreadsheets are generated according to a specific embodiment of the invention.

Referring back to FIG. 8, creation of analysis spreadsheets, i.e., workbook 2, (step 808) will be described with reference to FIG. 12. Initially, the spreadsheet workbook is created using a template (1202), the form of which will be described in greater detail below. The first pattern description from the spreadsheets of workbook 1 is selected (1204) and a spreadsheet incorporating the pattern description is added to workbook 2 (1206). If there are additional patterns for which spreadsheets have not been generated (1208), the next pattern is selected (1210) and a corresponding spreadsheet is added to workbook 2 (1206). In this way, a spreadsheet is created for each pattern in workbook 1 according to the same template. When there are no more patterns from workbook 1 (1208), the process ends.

Referring again to FIG. 4, the design description files (.TDF and .ACF) are compiled in compiler 404 (as facilitated by the shell scripts) generating a device bit stream (POF) which, along with the PCT-3 files, is sent to product engineering as represented by PC tester PCT-3 (406). In PCT-3 (i.e., product engineering) actual delay data are measured using the compiled design description files and the PCT-3 files to test an actual device. Techniques for measuring such delay data are described in commonly assigned, copending U.S. patent application Ser. No. 08/850,790 entitled ELECTRONIC CIRCUIT TESTING METHODS AND APPARATUS filed on May 2, 1997, the entirety of which is incorporated herein by reference for all purposes. The measured delay data are organized in product engineering (PE) spreadsheets, i.e., "results". These data represent the actual register-to-register delays for the target device.

Figure 13:
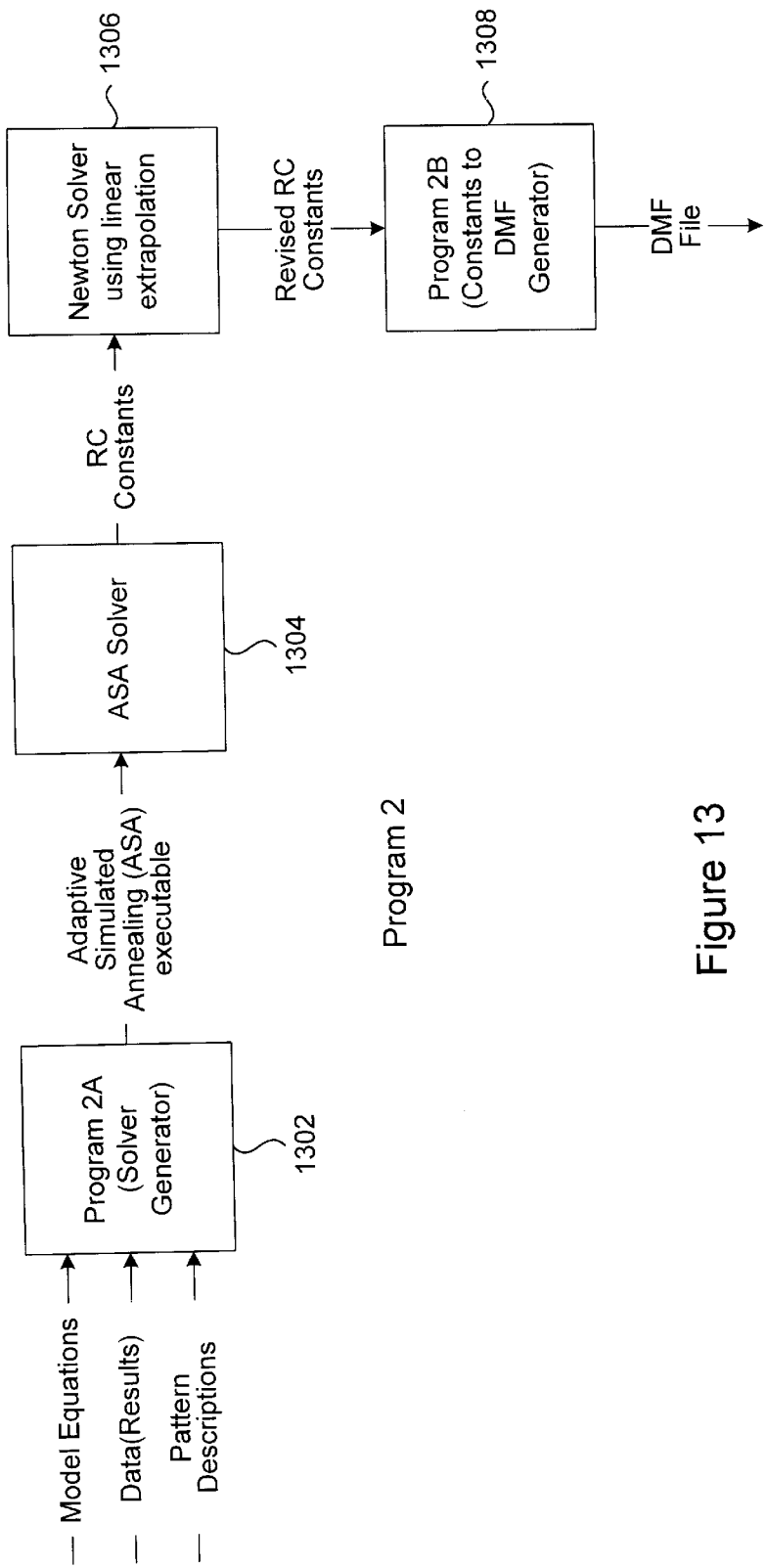
FIG. 13 is a flow diagram illustrating a process by which a device model is generated according to a specific embodiment of the invention.

As shown in FIGS. 4 and 13, program 2 (408) takes as inputs the analysis spreadsheets of workbook 2, i.e., "Pattern Descriptions", the measured delay data in the PE spreadsheets, i.e., "results", and a set of mathematical equations modeling the device interconnect lines as a distributed network of resistors and capacitors, i.e., "Model Equations", as described in U.S. patent application Ser. No. 08/940,248 incorporated by reference above. Maximum, minimum, and initial guess values for each resistor and capacitor are also provided to Program 2 as will be discussed. Using these inputs, Program 2 generates a device model, i.e., "Device Model File", for delay simulation. The process by which this occurs will be discussed with reference to FIG. 13.

Program 2A (the "Solver Generator") reads the measured delay data from the PE spreadsheets and copies them to the appropriate analysis spreadsheet from workbook 2. As mentioned above, each analysis spreadsheet corresponds to one of the original patterns from workbook 1. Each analysis spreadsheet has a section which describes the pattern for the sheet in a similar notation as in workbook 1 (see FIG. 5). A second section shows the measured delay data from the corresponding PE spreadsheet. A third section receives modeled delay data after a simulation of the device model is run as described below. A final "delta" section shows the differences between corresponding measured and modeled delay data. Program 2A also takes as input a set of initial guesses for the resistor and capacitor constants as input by the user.

Using the model equations, the analysis spreadsheets with the measured delay data, and the initial guesses, Program 2A (1302) generates a solver 1304 which employs the technique of Adaptive Simulated Annealing (ASA) to solve for the unknowns in the model equations, i.e., the resistor and capacitor constants. That is, Program 2A generates the C and H executables which are then compiled to generate the ASA solver executable, i.e., ASA solver 1304. ASA solver 1304 then generates values for the resistor and capacitor constants. A Newton Solver 1306 then revises the resistor and capacitor constants using linear extrapolation.

The revised resistor and capacitor constants are then employed by Program 2B (1308), a device model generator, to create a model description, i.e., a device model file (DMF), which may be run using appropriate device model simulation software. An example of such device model simulation software is known as Max+Plus II and was developed by Altera Corporation of San Jose, Calif.

Referring once again to FIG. 4, the device model file generated by Program 2B is then run using device model simulation software 410 and the design description files (.TDF and .ACF) generated by Program 1. The results of this simulation are modeled delay data which initially are estimates of the delays for the device model. As discussed above, the modeled delay data are written into the appropriate portion of the analysis spreadsheets of workbook 2.

The modeled delay data are compared to the actual measured delay data, i.e., "results", as represented by Model Checker 412. If the comparison is favorable, the procedure is complete. If not, the process returns to Program 2 and the process iterates until the comparison is favorable. For each successive iteration the resistor and capacitor values are adjusted based on the comparison of the simulated delays with the measured delays. The comparison is made using the data in the "delta" section of the analysis spreadsheets of workbook 2.

While the invention has been particularly shown and described with reference to specific embodiments thereof, it will be understood by those skilled in the art that changes in the form and details of the disclosed embodiments may be made without departing from the spirit or scope of the invention. For example, the techniques described herein employ data organized in spreadsheets. It will be understood, however, that the interconnect data may be represented in a variety of ways without departing from the scope of the invention. For example, interconnect data may be represented using any of a wide variety of commercially available database applications.

Moreover, specific embodiments have been described herein with reference to the determination of the parameters for a specific circuit model of the PLD interconnect lines. It will be understood, however, that the techniques described herein may be applied to a wide variety of circuit models and that the use of a particular circuit model herein is merely exemplary. Therefore, the scope of the invention should be determined with reference to the appended claims.

What is claimed is:

1. A method for generating circuit parameters for a plurality of interconnect line circuit models, the plurality of circuit models representing a plurality of interconnect lines in a programmable logic device (PLD), the method comprising:

generating design description data corresponding to the PLD at least in part from interconnect line data representing the plurality of interconnect lines;

generating a device model for the PLD using estimated circuit parameters and a plurality of mathematical equations representing the plurality of interconnect line circuit models;

simulating operation of the PLD using the device model and the design description data thereby generating modeled delay data corresponding to the estimated circuit parameters;

comparing the modeled delay data with measured delay data corresponding to the plurality of interconnect lines; and where all of the modeled delay data are within an error limit of corresponding measured delay data, designating the estimated circuit parameters as the circuit parameters.

2. The method of claim 1 wherein the interconnect line data comprise spreadsheet representations of the plurality of interconnect lines.

3. The method of claim 2 wherein generating design description data comprises generating a plurality of design description files corresponding to a hardware description of the PLD, the method further comprising:

compiling the design description files to generate the design description data; and measuring actual delays for each of the plurality of interconnect lines in the PLD thereby generating the measured delay data.

4. The method of claim 2 wherein generating the device model comprises generating a device model file and wherein simulating operation of the PLD comprises compiling and simulating the device model file and the design description data.

5. The method of claim 2 further comprising:

generating a plurality of spreadsheets from the spreadsheet representations of the plurality of interconnect lines, each of the spreadsheets corresponding to one of the plurality of interconnect lines; and incorporating the measured delay data and the modeled delay data into the plurality of spreadsheets;

wherein comparing the modeled delay data with the measured delay data comprises generating delta data representing differences between corresponding modeled and measured delay data.

6. The method of claim 5 wherein each of the plurality of spreadsheets comprises:

a pattern section representing the corresponding interconnect line;

a measured data section for recording the measured delay data;

a modeled delay data for recording the modeled delay data; and a delta section for recording the delta data.

7. The method of claim 2 further comprising, where some of the modeled delay data are not within an error limit of corresponding measured delay data, manipulating selected ones of the estimated circuit parameters and repeating simulation of the operation of the PLD.

8. The method of claim 7 wherein manipulation of the estimated circuit parameters and simulation of the operation of the PLD are repeated until all of the modeled delay data are within the error limit of corresponding measured delay data.

9. The method of claim 2 wherein the spreadsheet representation of each interconnect line comprises a plurality of consecutive spreadsheet cells, each spreadsheet cell representing a connection point within the PLD for the corresponding interconnect line.

10. The method of claim 2 wherein selected ones of the plurality of interconnect line circuit models comprise a ladder network of resistors and capacitors.

11. The method of claim 10 wherein the selected interconnect line circuit models further comprise a plurality of load models coupled to the ladder network representing loads on the corresponding interconnect line in the PLD.

12. The method of claim 2 wherein generation of the device model employs adaptive simulated annealing (ASA).

13. The method of claim 12 further comprising:
generating C and H files using the estimated circuit parameters and the mathematical equations;
compiling the C and H files thereby generating an ASA solver executable;
running the ASA solver executable to generate first revised estimated circuit parameters;
revising the first revised estimated parameter using linear interpolation thereby generating second revised estimated circuit parameters; and
generating a device model file representing the device model using the second revised estimated circuit parameters.

14. The method of claim 2 wherein the estimated circuit parameters are designated as the circuit parameters only where all of the modeled delay data are greater than or equal to the corresponding measured delay data.

15. The method of claim 2 wherein the estimated circuit parameters are designated as the circuit parameters only where all of the modeled delay data are greater than or equal to the corresponding measured delay data plus a guardband value.

16. A computer program product for generating circuit parameters for a plurality of interconnect line circuit models, the plurality of circuit models representing a plurality of interconnect lines in a programmable logic device (PLD), the computer program product comprising:
at least one computer-readable medium; and
at least one computer program mechanism embedded in the at least one computer-readable medium for causing at least one computer to perform the steps of:
generating design description data corresponding to the PLD at least in part from spreadsheet representations of the plurality of interconnect lines;
generating a device model for the PLD using estimated circuit parameters and a plurality of mathematical equations representing the plurality of interconnect line circuit models;
simulating operation of the PLD using the device model and the design description data thereby generating modeled delay data corresponding to the estimated circuit parameters;
comparing the modeled delay data with measured delay data corresponding to the plurality of interconnect lines; and
where all of the modeled delay data are within an error limit of corresponding measured delay data, designating the estimated circuit parameters as the circuit parameters.

17. A programmable logic device (PLD) having a circuit design programmed therein, the circuit design having been simulated using a plurality of interconnect line circuit models representing a plurality of interconnect lines in the PLD, the interconnect line circuit models having circuit parameters associated therewith, the circuit parameters being generated according to a method comprising:
generating design description data corresponding to the PLD at least in part from spreadsheet representations of the plurality of interconnect lines;
generating a device model for the PLD using estimated circuit parameters and a plurality of mathematical equations representing the plurality of interconnect line circuit models;
simulating operation of the PLD using the device model and the design description data thereby generating modeled delay data corresponding to the estimated circuit parameters;
comparing the modeled delay data with measured delay data corresponding to the plurality of interconnect lines; and
where all of the modeled delay data are within an error limit of corresponding measured delay data, designating the estimated circuit parameters as the circuit parameters.

18. A method for verifying a circuit design for a programmable logic device comprising simulating the circuit design using a plurality of interconnect line circuit models representing a plurality of interconnect lines in the PLD, the interconnect line circuit models having circuit parameters associated therewith, the circuit parameters being generated according to a method comprising:
generating design description data corresponding to the PLD at least in part from spreadsheet representations of the plurality of interconnect lines;
generating a device model for the PLD using estimated circuit parameters and a plurality of mathematical equations representing the plurality of interconnect line circuit models;
simulating operation of the PLD using the device model and the design description data thereby generating modeled delay data corresponding to the estimated circuit parameters;
comparing the modeled delay data with measured delay data corresponding to the plurality of interconnect lines; and
where all of the modeled delay data are within an error limit of corresponding measured delay data, designating the estimated circuit parameters as the circuit parameters.

19. A method for generating circuit parameters for a plurality of interconnect line circuit models, the plurality of circuit models representing a plurality of interconnect lines in a programmable logic device (PLD), the method comprising:
1) generating design description files at least in part from spreadsheet representations of the plurality of interconnect lines, the design description files corresponding to a hardware representation of the PLD;
2) generating a plurality of spreadsheets from the spreadsheet representations, each of the spreadsheets corresponding to one of the plurality of interconnect lines;
3) measuring actual delays for each of the plurality of interconnect lines in the PLD thereby generating measured delay data;

4) generating a device model for the PLD using the spreadsheet representations, estimated circuit parameters, and a plurality of mathematical equations representing the plurality of interconnect line circuit models;

5) simulating operation of the PLD using the device model and the design description files thereby generating modeled delay data corresponding to the estimated circuit parameters;

6) incorporating the modeled delay data and the measured delay data into the plurality of spreadsheets thereby generating delta data representing differences between corresponding modeled and measured delay data;

8) where all of the modeled delay data are within an error limit of corresponding measured delay data, designating the preliminary interconnect parameters as the interconnect parameters; and 9) where at least some of the modeled delay data are not within the error limit, repeating steps (4)–(9).

* * * * *